(12) United States Patent
Morgan

(10) Patent No.: US 7,988,457 B1
(45) Date of Patent: Aug. 2, 2011

(54) ELECTRICAL CONNECTOR ASSEMBLY HAVING REDUCED DEPTH TERMINALS

(75) Inventor: Chad William Morgan, Woolwich Township, NJ (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 12/729,958

(22) Filed: Mar. 23, 2010

(51) Int. Cl.
*H01R 12/00* (2006.01)
*H05K 1/00* (2006.01)

(52) U.S. Cl. .......................................... 439/65; 439/82
(58) Field of Classification Search .................... 439/65, 439/82, 79, 607.05, 751
See application file for complete search history.

(56) References Cited

U.S. PATENT DOCUMENTS

| | | | |
|---|---|---|---|
| 5,543,586 A | | 8/1996 | Crane, Jr. et al. |
| 5,667,412 A * | | 9/1997 | Takahashi et al. ............ 439/751 |
| 6,593,535 B2 * | | 7/2003 | Gailus ........................... 174/262 |
| 6,663,442 B1 * | | 12/2003 | Helster et al. ................. 439/751 |
| 7,540,744 B1 * | | 6/2009 | Minich ............................ 439/65 |
| 7,833,026 B1 * | | 11/2010 | Morgan et al. ................ 439/108 |
| 2004/0192078 A1 * | | 9/2004 | Matsuo ............................ 439/65 |
| 2007/0169961 A1 | | 7/2007 | Kwong et al. |
| 2007/0184687 A1 * | | 8/2007 | Kanai et al. .................... 439/79 |
| 2010/0015822 A1 * | | 1/2010 | Morgan et al. ................. 439/83 |

* cited by examiner

*Primary Examiner* — Hae Moon Hyeon

(57) ABSTRACT

An electrical connector assembly includes a circuit board having vias extending at least partially through the circuit hoard along parallel via axes. The circuit board includes electrical conductors exposed within corresponding vias that extend between a top and a bottom. The electrical connector assembly also includes an electrical connector mounted on the circuit board that includes a housing having a mounting face configured to be mounted along the circuit board, and a plurality of variable depth signal terminals held by the housing. The signal terminals each include mounting contacts extending outward from the mounting face of the housing that are received in respective vias of the circuit board. The mounting contacts extend different depths into respective vias of the circuit board to engage the corresponding electrical conductors. The mounting contacts have a mounting end arranged at substantially the same depth within the via as the bottom of the electrical conductor.

20 Claims, 6 Drawing Sheets

ELECTRICAL CONNECTOR ASSEMBLY HAVING REDUCED DEPTH TERMINALS

BACKGROUND OF THE INVENTION

The subject matter described and/or illustrated herein relates generally to electrical connector systems and, more particularly, to electrical connectors that are mounted on circuit boards.

To meet digital multi-media demands, higher data throughput is often desired for current digital communications equipment. Electrical connectors that interconnect circuit boards must therefore handle ever increasing signal speeds at ever increasing signal densities. One application environment that uses such electrical connectors is in high speed, differential electrical connectors, such as those common in the telecommunications or computing environments. In a traditional approach, two circuit boards are interconnected with one another in a backplane and a daughter board configuration. However, at the footprints of the circuit boards where the electrical connectors connect thereto it may be difficult to improve density while maintaining electrical performance and/or reasonable manufacturing cost. For example, in known circuit boards, one primary source of electrical degradation comes from the existence of signal vias within the circuit boards that are plated, creating plated through holes (PTHs). Contacts extending from the electrical connectors are connected to the PTHs, and thus traces in the circuit board, using eye-of-the-needle contacts.

To overcome electrical degradation problems associated with the PTHs, at least some known systems counterbore portions of the PTHs away to remove the plating to an area just in the vicinity of the corresponding trace in the circuit board. However, such systems are not without disadvantages. For example, the contacts that mate to the PTHs can still extend beyond the PTHs. Such portions of the contacts create significant electrical degradation due to the parasitic capacitance that is created by any piece of 'stub' metal that extends beyond the printed circuit board (PCB) target layer. The problems with the contacts are particularly exaggerated when the PTHs are at the upper layers of the circuit board, where the contacts extend for significant distances below the PCB target layer. The problems with the contacts are particularly exaggerated when the PTHs are at the upper layers of the circuit board, where the contacts extend for significant distances below the PCB target layer.

To achieve higher system densities and speed, further improvement of circuit board footprints and connections to the circuit boards must be made over known approaches. There is a need for an electrical connector that enables improvement of the density and/or electrical performance of circuit board footprints to achieve higher system densities and/or higher system speeds.

BRIEF DESCRIPTION OF THE INVENTION

In one embodiment, an electrical connector assembly is provided that includes a circuit board having vias extending at least partially through the circuit board along parallel via axes. The circuit board includes electrical conductors exposed within corresponding vias that extend between a top and a bottom. The electrical connector assembly also includes an electrical connector mounted on the circuit board that includes a housing having a mounting face configured to be mounted along the circuit board, and a plurality of variable depth signal terminals held by the housing. The signal terminals each include mounting contacts extending outward from the mounting face of the housing that are received in respective vias of the circuit board. The mounting contacts extend different depths into respective vias of the circuit board to engage the corresponding electrical conductors. The mounting contacts have a mounting end arranged at substantially the same depth within the via as the bottom of the electrical conductor.

In another embodiment, an electrical connector assembly is provided including a circuit board having vias extending at least partially through the circuit board along parallel via axes. The circuit board has electrical conductors exposed within corresponding vias that extend between a top and a bottom. The electrical connector assembly includes an electrical connector mounted on the circuit board having a plurality of signal terminals held by the housing. The signal terminals have mounting contacts received in respective vias of the circuit board, wherein the mounting contacts are counterbored to the vicinity of the bottom of the electrical conductor.

In a further embodiment, an electrical connector is provided for mounting on a circuit board having vias with electrical conductors within the vias. The electrical connector includes a housing having a mounting face configured to be mounted along the circuit board, and a plurality of variable depth signal terminals held by the housing. The signal terminals are configured to extend different depths into respective vias of the circuit board and are arranged in pairs carrying differential pair signals. The signal terminals of each pair extend to the same depth in the respective vias of the circuit board. The signal terminals include mounting contacts extending outward from the mounting face of the housing, where each mounting contact has a mounting end being at substantially the same depth within the via as the electrical conductor.

DETAILED DESCRIPTION OF THE INVENTION

Figure 1:
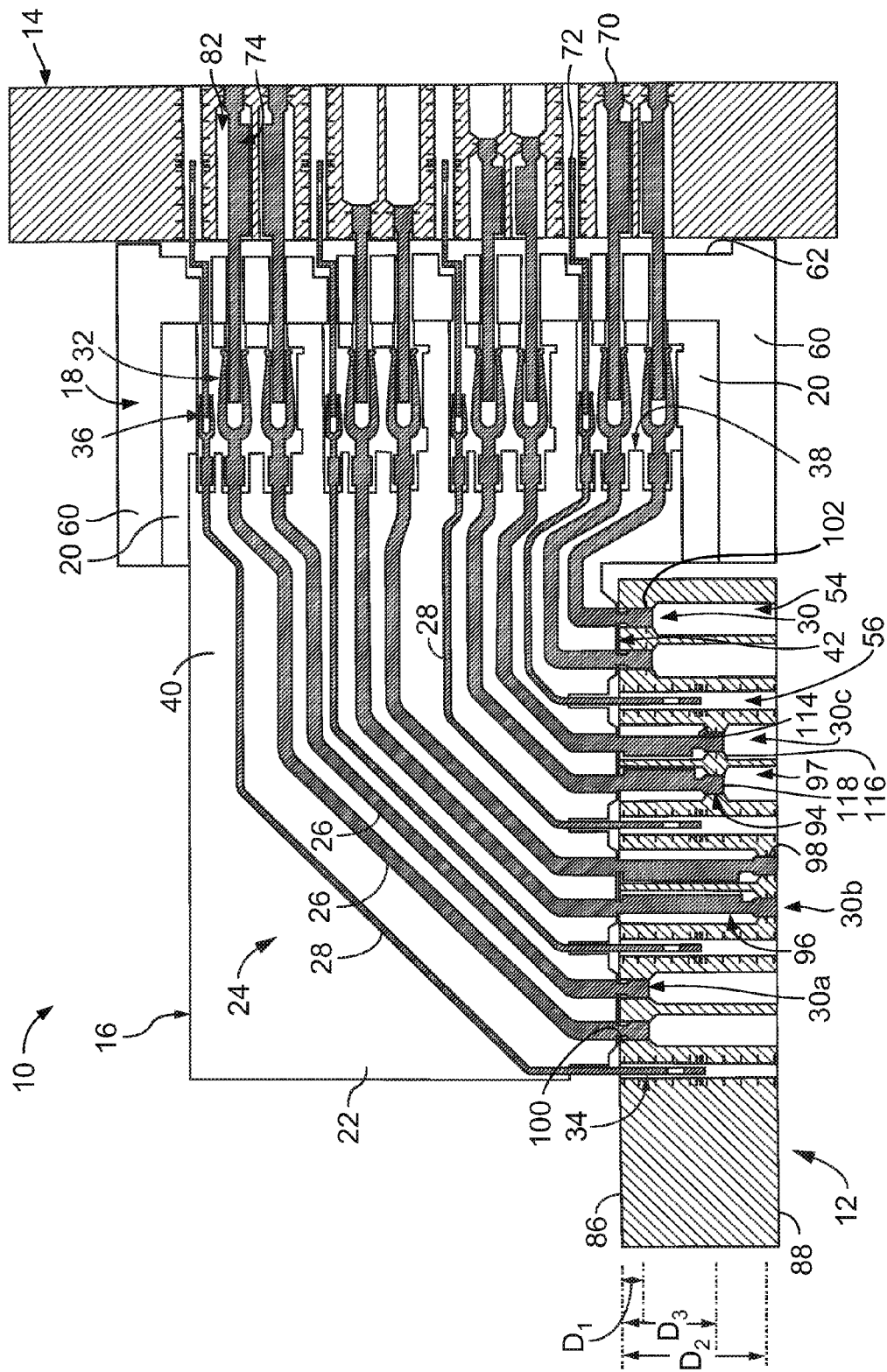
FIG. 1 is a cross-sectional view of an exemplary embodiment of an electrical connector assembly illustrating electrical connectors mounted to circuit boards.

FIG. 1 is a cross-sectional view of an exemplary embodiment of an electrical connector assembly 10. The connector assembly 10 includes a pair of circuit boards 12 and 14, a receptacle connector 16, and a header connector 18. The receptacle connector 16 is mounted on the circuit board 12, and the header connector 18 is mounted on the circuit board 14. The receptacle connector 16 and the header connector 18 are connected together to electrically connect the circuit boards 12 and 14. In the exemplary embodiment of FIG. 1, the receptacle connector 16 and the header connector 18 are oriented such that the connectors 16 and 18 form an approximate right-angle connection between the circuit boards 12 and 14. Alternatively, the receptacle connector 16 and the header connector 18 may be oriented such that the circuit boards 12 and 14 are oriented at any other angle relative to each other, such as, but not limited to approximately parallel. The subject matter herein may be described with reference to either the circuit board 12 or the circuit board 14, however it is realized that features or elements described relative to one of the circuit boards 12 or 14 may apply equally to the other circuit board 12 or 14. Similarly, the subject matter herein may be described with reference to either the receptacle connector 16 or the header connector 18, however it is realized that features or elements described relative to one of the receptacle connector 16 or the header connector 18 may apply equally to the other of the receptacle connector 16 or the header connector 18.

The receptacle connector 16 includes a dielectric housing 20 that, in the illustrated embodiment, holds a plurality of parallel contact modules 22 (one of which is illustrated in FIG. 1). The contact module 22 includes a contact lead frame 24 that includes a plurality of signal terminals 26 and/or a plurality of ground terminals 28. Each signal terminal 26 includes a mounting contact 30 at one end portion of the signal terminal 26 and a mating contact 32 at an opposite end portion of the signal terminal 26. Similarly, each ground terminal 28 includes a mounting contact 34 at one end portion of the ground terminal 28 and a mating contact 36 at an opposite end portion of the ground terminal 28. The mating contacts 32 and 36 extend outward from, and along, a mating face 38 of the contact module 22. The signal terminals 26 are optionally arranged in differential pairs.

Each contact module 22 includes a dielectric contact module housing 40 that holds the corresponding lead frame 24. Each contact module housing 40 includes the mating face 38 and a mounting face 42. In the illustrated embodiment, the mating face 38 is approximately perpendicular to the mounting face 42. However, the mating face 38 and mounting face 42 may be oriented at any other angle relative to each other, such as, but not limited to, approximately parallel. The mating face 38 of each contact module is received in the housing 20 and is configured to mate with corresponding mating contacts of the header connector 18.

The mounting face 42 of each of the contact modules 22 is configured for mounting on a circuit board, such as, but not limited to, the circuit board 12. The mounting contacts 30 and 34 extend outward from, and along, the mounting face 42 of the contact modules 22 for mechanical and electrical connection to the circuit board 12. Specifically, each of the mounting contacts 30 and 34 is configured to be received within a corresponding via 54 and 56, respectively, within the circuit board 12.

In an exemplary embodiment, the signal terminals 26 constitute variable depth connection terminals, where some of the mounting contacts 30 extend different lengths from the mounting face 42 than others of the mounting contacts 30 (whether the others are on the same contact module 22 or a different contact module 22). The mounting contacts 30 extend to different mating depths for mating with corresponding mounting pads 102 embedded within the circuit board 12. For example, a differential pair 30a of the mounting contacts 30 extends to a mating depth $D_1$ from the mounting face 42, a differential pair 30b of the mounting contacts 30 extends to a mating depth $D_2$ from the mounting face 42, and a differential pair 30c of the mounting contacts 30 extends to a mating depth $D_3$ from the mounting face 42. The depths $D_1$-$D_3$ are each different. Any of the mounting contacts 30 of the receptacle connector 16 may have a different length, and thus a different mating depth, from the corresponding mounting face 42 than any other mounting contact 30 of the receptacle connector 16. The pattern of the lengths of the mounting contacts 30 shown herein is meant as exemplary only. In an alternative embodiment, rather than being variable depth connection terminals, the mounting contacts 30 may each extend the same length from the mounting face 42, but still connect to mounting pads 102 at different depths. The bottom-most segments of the mounting contacts 30 may then be removed to shorten the mounting contacts 30 within the vias 54, as described in further detail below.

The header connector 18 includes a dielectric housing 60 that receives the receptacle connector 16 and a mounting face 62 for mounting the header connector 18 to a circuit board, such as, but not limited to the circuit board 14. The housing 60 holds a plurality of signal terminals 70 and a plurality of ground terminals 72. The signal terminals 70 are optionally arranged in differential pairs, as shown in the illustrated embodiment.

Each signal terminal 70 includes a mounting contact 74 at one end portion of the signal terminal 70. Each of the mounting contacts 74 is configured to be received within a corresponding via 82 within the circuit board 14. Similar to the mounting contacts 30 of the receptacle connector 16, some of the mounting contacts 74 of the signal terminals 70 extend different lengths from the mounting face 62 of the header connector 18 than others of the mounting contacts 74. The mounting contacts 74 may be modified in a similar manner as the mounting contacts 30, as will be described in further detail below.

The circuit board 12 includes a substrate having a pair of opposite upper and lower surfaces 86 and 88. The mounting face 42 of each of the contact modules 22 is configured to be mounted along the upper surface 86 such that the receptacle connector 16 is mounted on the upper surface 86 of the circuit board 12. The circuit board 12 includes the plurality of vias 54 and 56 that receive the mounting contacts 30 and 34, respectively, of the respective signal and ground terminals 26 and 28. The circuit board 14 may be formed in a similar manner as the circuit board 12.

The vias 54 include a smaller diameter portion 94 and one or more larger diameter portions 96, 97. The larger diameter portion 96 is arranged above the smaller diameter portions 94, and may be referred to as an upper via 96. The larger diameter portion 97 is arranged below the smaller diameter portion 94, and may be referred to as a lower via 97. The smaller diameter portion 94 includes an electrical conductor 98 on a surface 100 defining the smaller diameter portion 94 of the via 54. Each electrical conductor 98 defines an electrical contact portion for electrical connection with a corresponding one of the mounting contacts 30 of the signal terminals 26. In one embodiment, the electrical conductor 98 is a conductive barrel that is electrically connected to the corresponding mounting pad 102, which forms a mounting portion of a signal trace (not shown) of the circuit board 12. In another embodiment, the electrical conductor 98 is the mounting pad 102 itself; which is at least partially exposed within the via 54. The mounting pad 102 may be exposed by a boring process exposing interior sides of the mounting pad, or alternatively, the mounting pad 102 may be exposed by laser drilling to expose a top, bottom and/or internal sides of the mounting pad 102. The electrical conductors 98 of the vias 54 are each electrically connected to a different signal trace on one of the layers of the circuit board 12.

The electrical conductors 98 of some of the vias 54 are located at different depths within the corresponding via 54 relative to the surface 86 of the circuit board 12 than the electrical conductors 98 of others of the vias 54. The depth corresponds to the particular layer having the corresponding mounting pad 102. Each electrical conductor 98 may be formed by any suitable method, process, means, and/or the like, such as, but not limited to, plating and/or the like. Each of the vias 54 may be formed using any suitable method, process, means, and/or the like, such as, but not limited to, boring, laser drilling and/or the like.

In an exemplary embodiment, the vias 54 are formed by forming an opening within the circuit board 12 to define the surface 100 of the smaller diameter portion 94, such as during an initial boring process. Next, the electrical conductor 98 is positioned on the surface 100, such as during a plating process. Thereafter, the upper via 96 is formed from the upper surface 86 down to the vicinity of the mounting pad 102, such as during a boring process. The boring operation will remove the surface 100 and the electrical conductor 98 from the entirety of the via 54 from the upper surface 86 down to the smaller diameter portion 94. As such, the boring process will define an upper rim 114 at a top of the electrical conductor 98.

When the receptacle connector 16 is mounted on the circuit board 12, the mounting contacts 30 are each received within the corresponding via 54, such that the mounting contacts 30 are electrically connected to the respective electrical conductor 98. Some of the mounting contacts 30 of the signal terminals 26 extend different depths, relative to the circuit board surface 86, into the corresponding via 54 than others of the mounting contacts 30 (whether the others are on the same contact module 22 or a different contact module 22). Although the mounting contacts 30 are shown herein as press-tit contacts, the mounting contacts 30 may each be any suitable type of electrical contact that enables the mounting contacts 30 to function as described herein.

Figure 4:
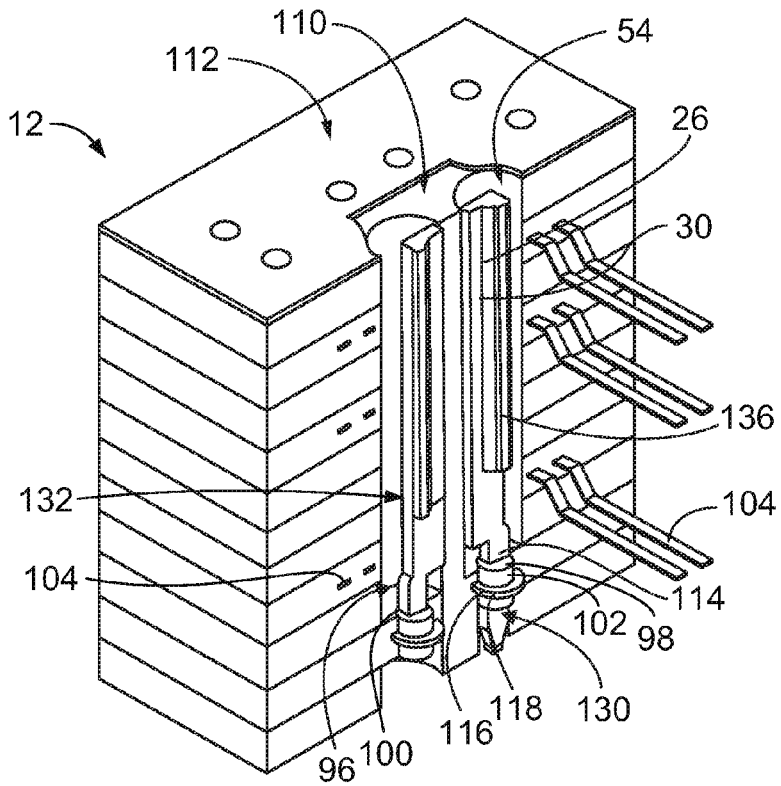
FIG. 4 is a partial cut-away view of the circuit board shown in FIG. 2 illustrating signal terminals mounted to the circuit board.
Figure 5:
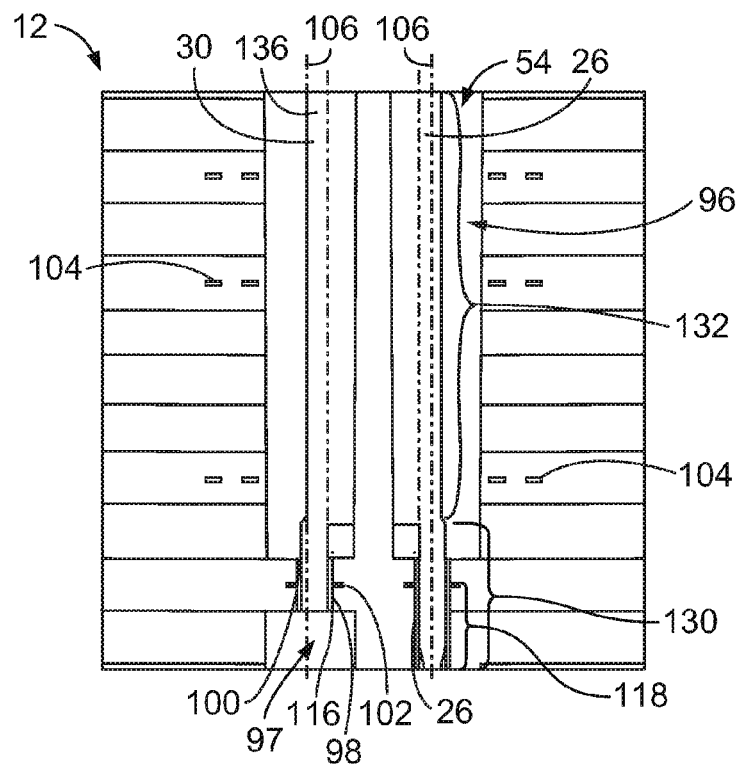
FIG. 5 is a side view of the circuit board and signal terminals shown in FIG. 4.

The lower via 97, below the electrical conductors 98, may be formed after the receptacle connector 18 is mounted to the circuit board 12, such as by a counterboring operation. Such counterboring operation will remove the surface 100 and the electrical conductor 98 from the entirety of the via 54 from the lower surface 88 up to the vicinity of the mounting pad 102. As such, the counterboring process will define a lower rim 116 at a bottom of the electrical conductor 98. In an exemplary embodiment, the counterboring process will also remove at least a portion of the mounting contact 30. For example, the bottom-most portion of the mounting contact 30 extending below the mounting pad 102, referred to hereinafter as the mounting contact stub 118 (an example of the entire mounting contact stub 118 is illustrated in FIGS. 4 and 5), is almost entirely removed. The counterboring is done to make the mounting contact stub 118 (i.e. the portion of the mounting contact 30 below the mounting pad 102) as short as possible without risking damage to the mounting pad 102. Other operations or processes other than counterboring may be used to remove the mounting contact stub 118 in alternative embodiments.

Figure 2:
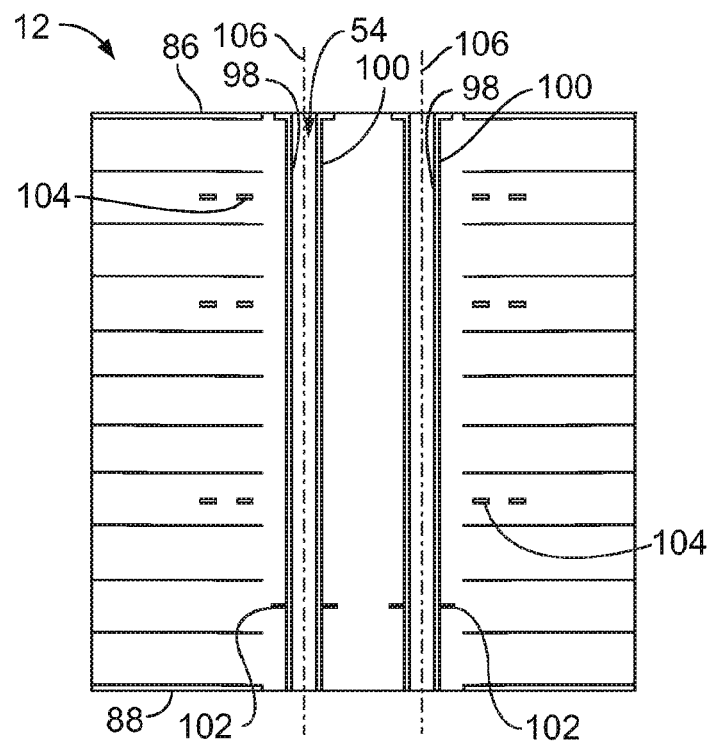
FIG. 2 is a partial cut-away view of one of the circuit boards during one stage of manufacture.

FIG. 2 is a partial cut-away view of the circuit board 12 during one stage of manufacture. The circuit board 12 includes a pair of the vias 54 extending through the layers of the circuit board 12 between the upper and lower surfaces 86, 88. The thickness of the circuit board 12 is a function of the number of layers, and the number of layers may depend, at least in part, on the number of components being connected to the circuit board 12. For example, a backplane circuit hoard may be substantially thicker than a daughtercard circuit board because many more electrical components are connected to the backplane circuit board as compared to the daughtercard circuit board, thus more layers are required to route the traces through the board.

In an exemplary embodiment, the vias 54 are formed by boring through the circuit board 12 at predetermined locations, such that the bore passes though corresponding mounting pads 102 in, or on, one of the layers. The mounting pads 102 are connected to corresponding signal traces (not shown) routed through the circuit board 12. The mounting pads 102 define the connection point between the receptacle connector 16 (shown in FIG. 1) and the circuit board 12. Boring through the circuit board 12 forms the surface 100, which is cylindrical and has a predetermined diameter. The thickness of the circuit board 12 may affect the diameter of the vias 54. For example, it is desirable to maintain a certain aspect ratio of circuit board thickness to via diameter in order to facilitate adequate plating of the via 54. If the diameters of the vias 54 are too small, as compared to the thickness of the circuit board 12, then the via 54 cannot be properly plated.

Once the vias 54 are bored, the surfaces 100 are plated, thus forming the electrical conductors 98. The plating process deposits a metal surface on the surface 100, which engages the mounting pads 102, thus creating an electrical connection between the mounting pads 102 and the electrical conductors 98. When the mounting contacts 30 (shown in FIG. 1) engage the electrical conductors 98, an electrical path is created between the mounting contacts 30 and the mounting pads 102.

Having the electrical conductors 98 in proximity to other traces 104 routed through the various layers of the circuit board 12 has a negative impact on the electrical performance of the system. For example, signal degradation due to cross-talk between the electrical conductors 98 and the traces 104 may result. The effects of the signal degradation may be impacted by the characteristics of the signals being transmitted by the electrical conductors 98 and/or the traces 104, such as, but not limited to, the signal transmission speed. In an exemplary embodiment, at least a portion of each electrical conductor 98 is removed during a boring process to reduce the length of the electrical conductor 98 along a via axis 106 thereof.

Figure 3:
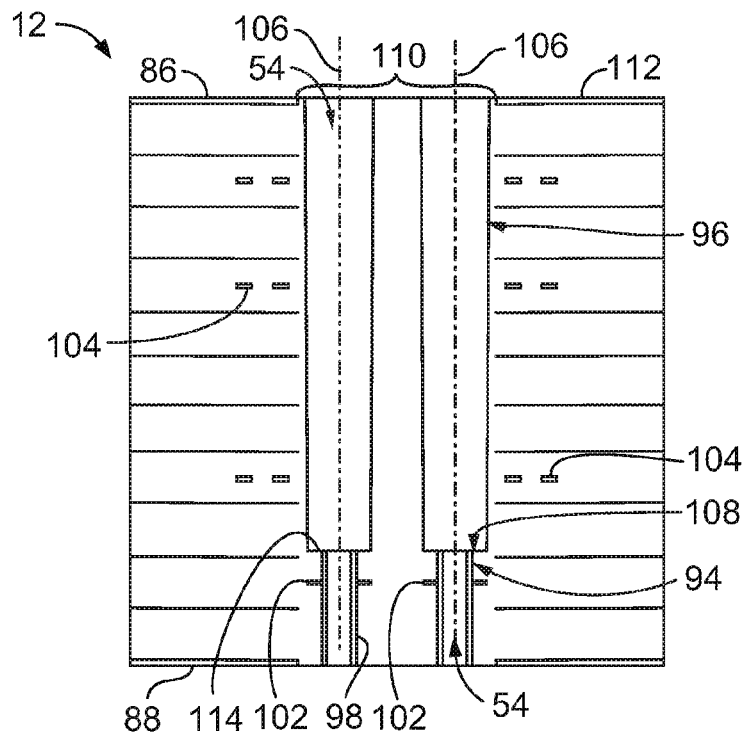
FIG. 3 is a partial cut-away view of the circuit board shown in FIG. 2 during another stage of manufacture.

FIG. 3 is a partial cut-away view of the circuit board 12 during another stage of manufacture after a secondary boring operation. In the illustrated embodiment, the vias 54 are counterbored from the top surface 86. The vias 54 are bored to the vicinity of the mounting pads 102, leaving the electrical conductor 98 extending from the bottom of the upper via 96 to the lower surface 88. The boring reduces cross-talk with neighboring traces 104. Boring from the top surface 86 may not be possible for each via 54. For example, vias 54 having electrical conductors 98 at or near one of the upper layers may not have any boring from the upper surface 86.

The boring defines the upper via 96 and a shoulder 108 at the interface between the upper via 96 and the smaller diameter portion 94. The shoulder 108 is a portion of the circuit board 12 that extends between the walls defining the upper via and the smaller diameter portion 94. The shoulder 108 may be at the same depth as the upper rim 114 because the counterboring process removes both the circuit board material and the electrical conductor material down to the same depth from the upper surface 86. Optionally, the shoulder 108 may be tapered downward toward the via axis 106. In an exemplary embodiment, the diameter of the smaller diameter portion 94 is approximately half the diameter of the upper via 96. Having a large diameter for the upper via 96 introduces air in the via 54 along the via axis 106 around the signal terminal 26 (shown in FIG. 4). The air affects interpair and intrapair coupling, such as by lowering cross-talk with neighboring traces 104 and/or raising impedance of the signal terminals 26. The diameter of the upper via 96 may be restricted by other components of the circuit board 12, such as the proximity of neighboring traces 104 to the vias 54 and/or the spacing between the vias 54 themselves. The diameter of the upper via 96 may be restricted by a size of one or more opening(s) 110, also known as an antipad, in one or more ground layer(s) 112. The opening 110 and the ground layer 112 are also illustrated in FIG. 4. The ground layer 112 is designed to be a certain distance from the mounting contacts 30 (shown in FIG. 1) to control impedance.

FIG. 4 is a partial cut-away view of the circuit board 12 illustrating the signal terminals 26 connected to the circuit board 12. FIG. 5 is a side view of the circuit board 12 and signal terminals 26. The mounting contacts 30 of the signal terminals 26 are the only portions of the signal terminals 26 illustrated in FIGS. 4 and 5. FIGS. 4 and 5 illustrate one of the vias 54 and corresponding mounting contact 30 after a tertiary counterboring operation, with the other via 54 and corresponding mounting contact 30 prior to a tertiary counterboring operation.

The mounting contacts 30 form part of the lead frame 24 (shown in FIG. 1), and are formed integral with the signal terminals 26 thereof. The mounting contacts 30 are the portions of the signal terminals 26 extending from the mounting face 42 of the contact modules 22 (both shown in FIG. 1). The mounting contacts 30 are received within the vias 54. The mounting contacts 30 include a mounting portion 130 and a transition portion 132. The mounting portion 130 engages the electrical conductor 98, and is thus electrically connected to the mounting pad 102 within the corresponding via 54. In the illustrated embodiment, the mounting portion 130 is represented by an eye-of-the-needle contact, however other types of contacts may be provided in alternative embodiments that may be subjected to counterboring. The length of the mounting portion 130 is sufficient to extend past the mounting pad 102 to ensure electrical contact thereto.

The transition portion 132 extends between the mounting face 42 and the mounting portion 130 within the upper via 96. In the illustrated embodiment, the transition portion 132 is generally offset with respect to the mounting portion 130, such as described in U.S. patent application Ser. No. 12/729,899, the complete subject matter of which is incorporated by reference herein. The amount of offset is established to control the impedance of the signal terminals 26 and/or cross-talk between the signal terminals 26 and neighboring traces 104. The upper vias 96 provide space for the transition portions 132 to be offset from the via axes 106. However, in alternative embodiments, the transition portion 132 and the mounting portion 130 may be generally coplanar.

In an exemplary embodiment, the transition portions 132 also include a folded over portion 136 along at least a portion of the length of the transition portion 132. The folded over portion 136 is defined during the forming process. The folded over portion 136 defines a strengthening rib, and may be referred to hereinafter as a strengthening rib 136. The strengthening rib 136 provides rigidity to the transition portion 132 and helps prevent buckling of the mounting contact 30 during mounting of the receptacle connector 16 to the circuit board 12. Optionally, the strengthening rib 136 may be formed by other methods or processes other than folding over the mounting contact 30, including being a separate piece that is attached to the mounting contact 30. In an alternative embodiment, a separate collar (not shown) may extend around the mounting contact 30 to provide support for the mounting contact 30 from buckling. The collar may be made from a dielectric material.

As noted above, once the receptacle connector 16 is mounted to the circuit board 12, the mounting contacts 30 extend into the vias 54. In an exemplary embodiment, once the mounting contacts 30 are positioned within the vias 54 and the mounting portions 130 are terminated to the electrical conductors 98, the mounting contact stub 118 is removed, such as by a counterboring process. The counterboring process forms the lower via 97 below the electrical conductors 98. Such counterboring operation will remove the surface 100 and the electrical conductor 98 from the entirety of the via 54 from the lower surface 88 up to the vicinity of the mounting pad 102. As such, the counterboring process will define the lower rim 116 of the electrical conductor 98. The counterboring reduces the length of the mounting contact stub 118 to a predetermined length, which is relatively short compared to the overall length of the mounting contact stub 118 prior to counterboring. In an exemplary embodiment, at least a majority of the mounting contact stub 118 is removed. Other operations or processes other than counterboring may be used to remove the mounting contact stub 118 in alternative embodiments.

Figure 6:
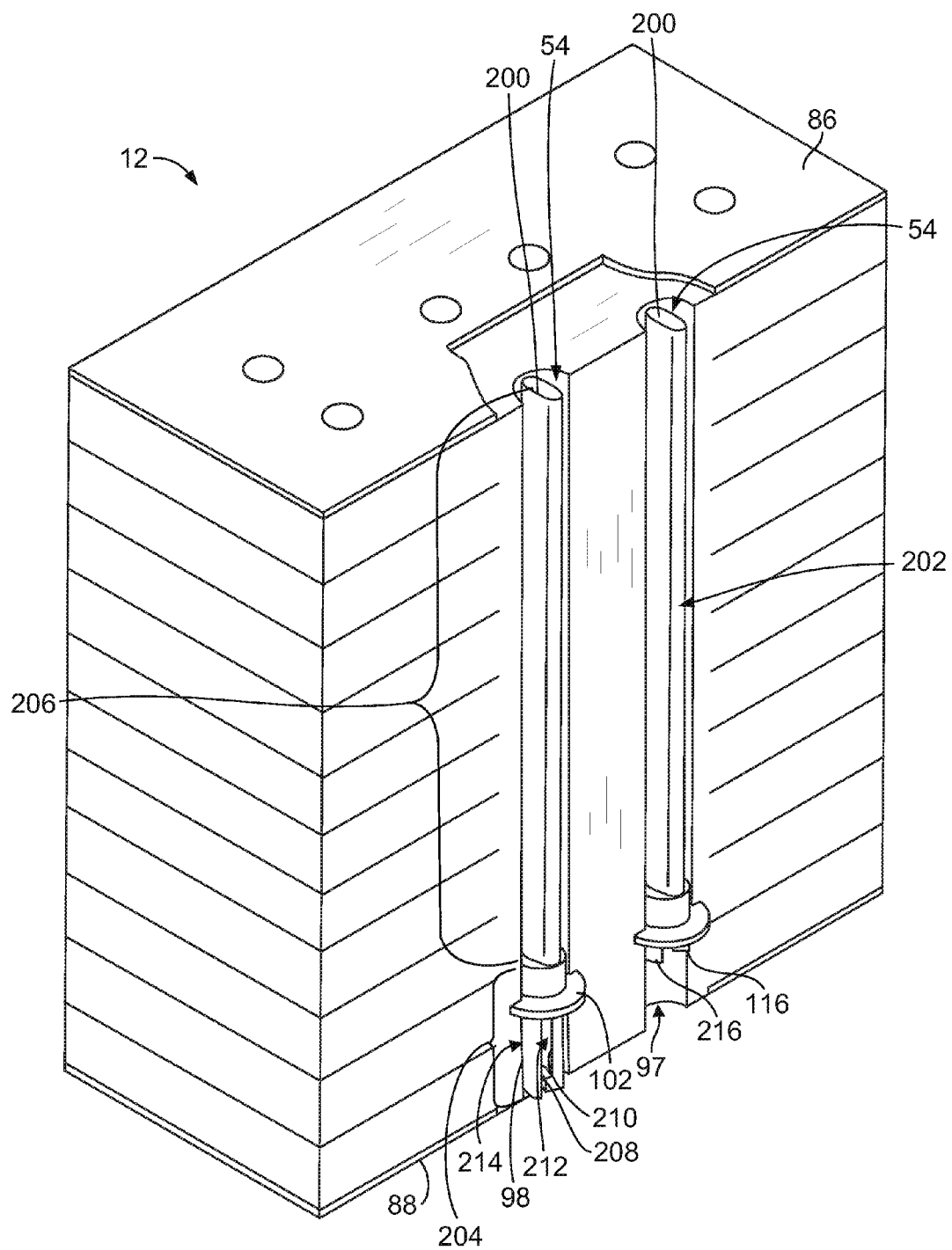
FIGS. 6-8 are partial cut-away views of the circuit board shown in FIG. 2 illustrating alternative signal terminals mounted to the circuit board.
Figure 7:
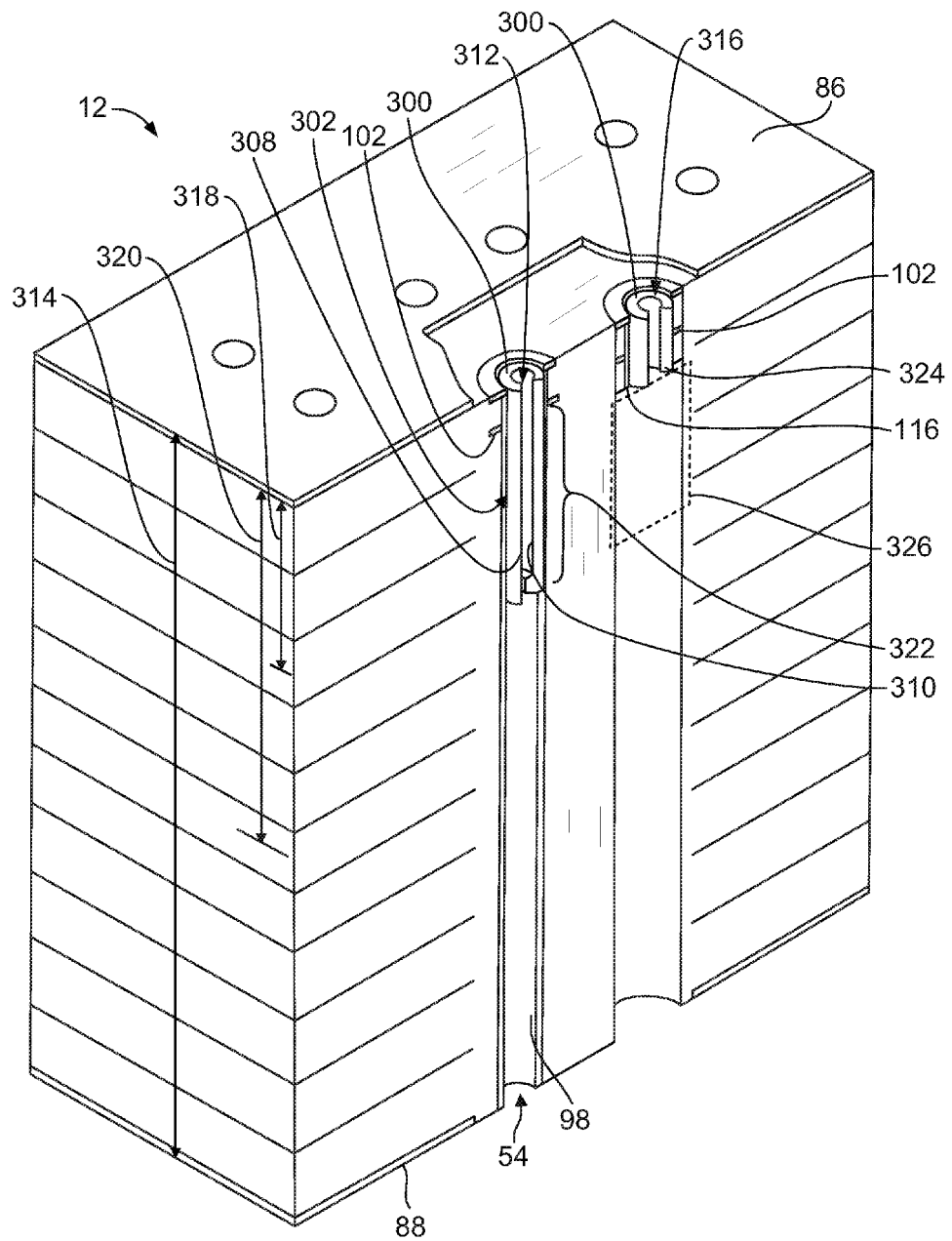
Figure 8:
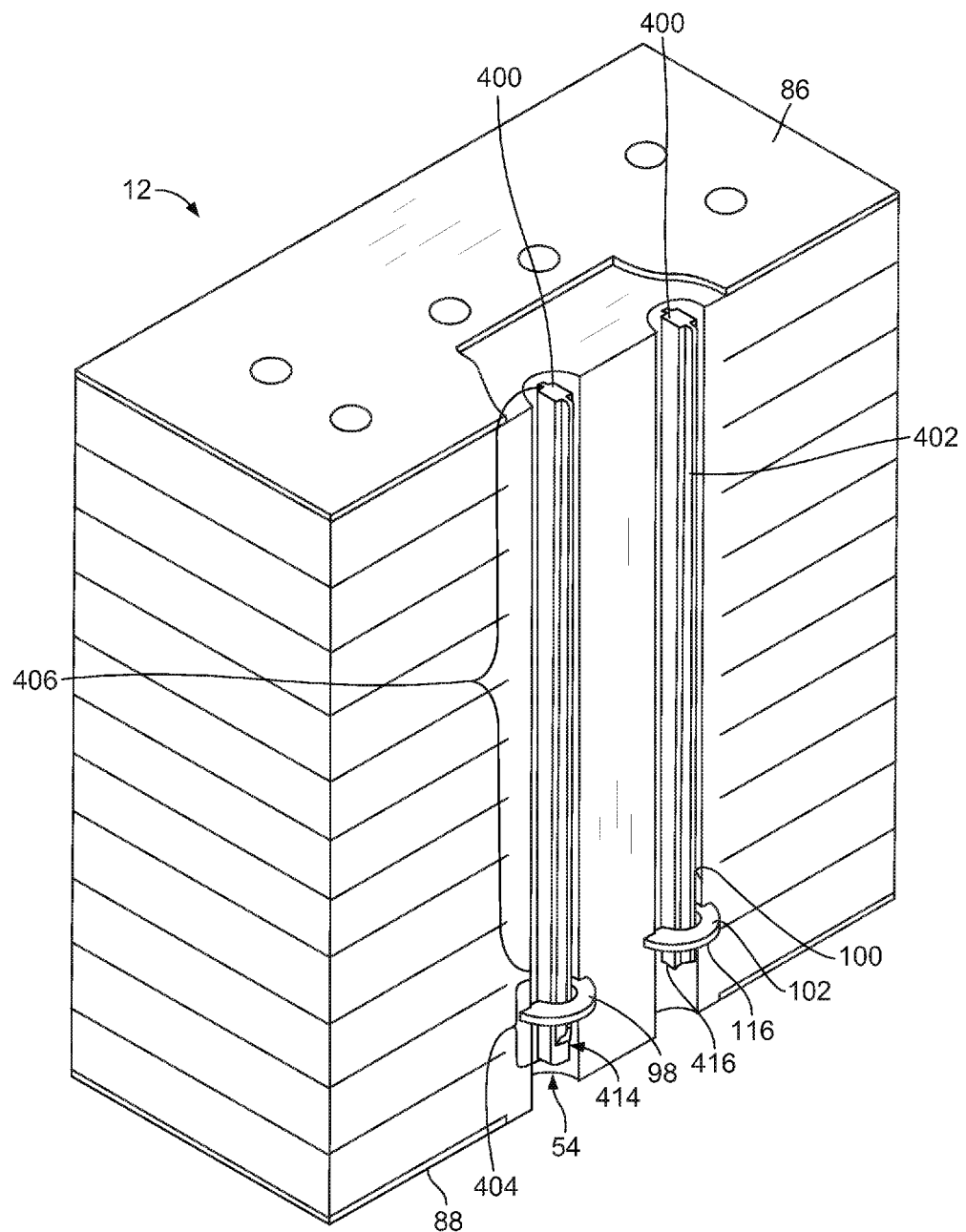

FIGS. 6-8 are partial cut-away views of the circuit board 12 illustrating alternative signal terminals 200, 300, 400, respectively, mounted to the circuit board 12. FIGS. 6-8 illustrate one of the vias 54 and corresponding signal terminals 200, 300, 400 after a secondary counterboring operation, with the other via 54 and corresponding signal terminals 200, 300, 400 prior to a secondary counterboring operation.

As shown in FIG. 6, the signal terminals 200 include mounting contacts 202 having mounting portions 204 and transition portions 206. The transition portions 206 extend between the mounting portions 204 and the upper surface 86 of the circuit board 12. The mounting portions 204 are generally C-shaped with opposite sides 208, 210 surrounding a hollow interior 212. The sides 208, 210 may be compressed toward one another to reduce the diameter of the mounting portion 204 to fit within the electrical conductor 98. When released, the C-shaped body tends to deflect outward toward the electrical conductor 98 to ensure contact with the electrical conductor 98.

During manufacture, the via 54 is counterbored from the lower surface 88 of the circuit board 12 to remove a segment of the electrical conductor 98, such as to the vicinity of the mounting pad 102. The counterboring defines the lower via 97. During the counterboring process, a portion of a mounting contact stub 214 is also removed. In an exemplary embodiment, a majority of the mounting contact stub 214 is removed during the counterboring process. Once counterbored, the mounting contacts 202 define a mounting end 216 that is at substantially the same depth within the via 54 as the bottom of the electrical conductor 98, defined by the lower rim 116. Additionally, both the lower rim 116 and the mounting end 216 are elevated above the lower surface 88 of the circuit board 12. The hollow interior 212 of the mounting portion 204 may provide a guide for the drill bit during the counterboring process.

As shown in FIG. 7, the signal terminals 300 include mounting contacts 302. The mounting contacts 302 are generally C-shaped, similar to the mounting portions 204 (shown in FIG. 6), with opposite sides 308, 310 surrounding a hollow interior 312. The mounting contacts 302 fit within corresponding vias 54 for mating the electrical conductor 98.

During manufacture, the via 54 is plated to define the electrical conductor 98. Optionally, the via 54 may be counterbored from the upper surface 86. However, in the illustrated embodiment, the mounting pads 102 are located in the upper layer of the circuit board 12. Because the mounting pads 102 are so high in the circuit board 12, no counterboring from the upper surface 86 is required. For mounting pads 102 that are in lower layers, counterboring from the upper surface 86 may be desired.

In the illustrated embodiment, the circuit board 12 has a thickness 314. The illustrated mounting pad 102 and corresponding electrical conductors 98 define a first subset 316 of electrical conductors 98, which are arranged in a first quartile 318 of the circuit board 12 representing an upper quartile. The signal terminals 300 are mounted to the circuit board 12 and extend into the vias 54. Optionally, as in the illustrated embodiment, the signal terminals 300 are variable depth signal terminals, and as such have a length that corresponds to the particular mounting location on the footprint of the circuit board 12. For example, because these particular signal terminals 300 are mounting to mounting pads 102 that are in the first quartile 318, the signal terminals 300 are relatively short. The mounting contacts 302 extend into a second quartile 320 of the circuit board 12, where the second quartile 320 is in an upper half of the circuit board 12. Longer mounting contacts 302 are not needed. However, it is realized that in alternative embodiments, equal length mounting contacts may be received in each via 54, which may make manufacture of the contact modules 22 (shown in FIG. 1) simpler. Each mounting contact 302 has a mounting contact stub 322 that extends below the level of the mounting pad 102. The mounting contact stub 322 of each mounting contact 302 is, removed after being mounted to the circuit board 12 such that mounting ends 324 of the mounting contacts 302, defined as the end of the mounting contacts 302 after counterboring, are arranged in the first quartile 318 of the circuit board 12. In other words, the overall length of the mounting contact 302 is shortened by the counterboring process, which may reduce stub capacitance in an interaction zone 326, shown in FIG. 7. Once counterbored, the mounting end 324 is at substantially the same depth within the via 54 as the bottom of the electrical conductor 98, defined by the lower rim 116. Additionally, both the lower rim 116 and the mounting end 324 are elevated above the lower surface 88 of the circuit board 12.

As shown in FIG. 8, the signal terminals 400 include mounting contacts 402 having mounting portions 404 and transition portions 406. The transition portions 406 extend between the mounting portions 404 and the upper surface 86 of the circuit board 12. The signal terminals 400 represent direct contact connection terminals that are configured to make direct contact with the mounting pads 102. The mounting pads 102 define the electrical conductors 98, rather than having plating on the surface 100.

During manufacture, the vias 54 are bored through the corresponding mounting pads 102. The vias 54 may or may not be bored from above. Once the mounting contacts 402 are mounted to the circuit board 12, and are electrically connected to the mounting pads 102, the vias 54 are counterbored from the lower surface 88 to the vicinity of the mounting pad 102. During the counterboring process, a portion of a mounting contact stub 414 is also removed. In an exemplary embodiment, a majority of the mounting contact stub 414 is removed during the counterboring process. Once counterbored, the mounting contacts 402 define a mounting end 416 that is at substantially the same depth within the via 54 as the bottom of the electrical conductor 98, defined by the lower rim 116 of the mounting pad 102. Additionally, both the lower rim 116 and the mounting end 416 are elevated above the lower surface 88 of the circuit board 12.

The embodiments described and/or illustrated herein provide an electrical connector that may enable improvement of the density and/or electrical performance of circuit board footprints to achieve higher system densities and/or higher system speeds. For example, the embodiments described and/ or illustrated herein, when left at the same density as at least some known systems, may decrease via to via coupling and may increase circuit board footprint impedance. Alternatively, the embodiments described and/or illustrated herein may be able to achieve higher footprint densities than at least some known systems while maintaining the same via to via coupling and impedance levels of such known systems. The embodiments described and/or illustrated herein may provide improved electrical characteristics between signal terminals of the electrical connector.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An electrical connector assembly comprising:
   a circuit board comprising vias extending at least partially through the circuit board along parallel via axes, the circuit board having electrical conductors exposed within corresponding vias, each electrical conductor extending between a top and a bottom of the electrical conductor; and
   an electrical connector mounted on the circuit board, the electrical connector comprising:
   a housing having a mounting face configured to be mounted along the circuit board; and
   a plurality of variable depth signal terminals held by the housing, the signal terminals each comprising mounting contacts extending outward from the mounting face of the housing, the mounting contacts being received in respective vias of the circuit board, the mounting contacts extending different depths into respective vias of the circuit board to engage the corresponding electrical conductors, the mounting contacts having a mounting end being at substantially the same depth within the via as the bottom of the electrical conductor.

2. The assembly of claim 1, wherein the circuit board has an upper surface and a lower surface, the electrical connector being mounted to the upper surface, the bottom and the mounting end are elevated above the lower surface of the circuit board.

3. The assembly of claim 1, wherein a segment of the mounting contact is removed during a counterboring process.

4. The assembly of claim 1, wherein the mounting contact is a C-shaped contact having a hollow interior, the mounting contact being configured to be counterbored, such that a bottom portion of the mounting contact is removed to the desired depth within the via.

5. The assembly of claim 1, wherein each via includes a mounting pad, the electrical conductor being electrically connected to the mounting pad, the vias each including a smaller diameter portion and a larger diameter portion defining a lower via, the smaller diameter portion being plated to define the electrical conductor, the lower via being counterbored after being plated, wherein a mounting contact stub of the mounting contacts within such lower via being removed during the counterboring.

6. The assembly of claim 1, wherein the circuit board includes a plurality of mounting pads at various depths within the circuit board, each via extending through a corresponding mounting pad, and wherein each mounting contact extends from the mounting face for approximately the same length when the housing is mounted to the circuit board, the mounting contacts extending beyond the corresponding mounting pads to define a mounting contact stub, a majority of each mounting contact stub being removed such that the mounting contacts have different lengths.

7. The assembly of claim 1, wherein the electrical conductor defines a mounting pad embedded within the circuit board, the mounting contacts being directly connected to the mounting pad.

8. The assembly of claim 1, wherein the circuit board has a thickness, the electrical conductors defining a first subset of electrical conductors arranged in a first quartile of the circuit board, the first quartile defining an upper quartile, wherein the mounting contacts being terminated to the first subset of electrical conductors extend into a second quartile of the circuit board, the second quartile being in an upper half of the circuit board, a mounting contact stub of each mounting contact being removed after the housing is mounted to the circuit board such that the mounting ends of the mounting contacts terminated to the first subset of electrical conductors are arranged in the first quartile of the circuit board.

9. An electrical connector assembly comprising:
a circuit board comprising vias extending at least partially through the circuit board along parallel via axes, the circuit board having electrical conductors exposed within corresponding vias, each electrical conductor extending between a top and a bottom of the electrical conductor; and
an electrical connector mounted on the circuit board, the electrical connector comprising a plurality of signal terminals held by a housing, the signal terminals having mounting contacts being received in respective vias of the circuit board, wherein the mounting contacts are counterbored to the vicinity of the bottom of the electrical conductor.

10. The assembly of claim 9, wherein the mounting contacts have mounting ends defined after the mounting contacts are counterbored, the bottoms and the mounting ends being elevated above a lower surface of the circuit board.

11. The assembly of claim 9, wherein the mounting contact is C-shaped having a hollow interior, a bottom portion of the mounting contact being removed to a desired depth within the via during the counterboring process.

12. The assembly of claim 9, wherein each via includes a mounting pad, the electrical conductor being electrically connected to the mounting pad, the vias each including a smaller diameter portion and a larger diameter portion defining a lower via, the smaller diameter portion being plated to define the electrical conductor, the lower via being counterbored after being plated, wherein a mounting contact stub of the mounting contacts within such lower via being removed during the counterboring.

13. The assembly of claim 9, wherein the circuit board includes a plurality of mounting pads at various depths within the circuit board, each via extending through a corresponding mounting pad, and wherein each mounting contact extends from the mounting face for approximately the same length when the housing is mounted to the circuit board, the mounting contacts extending beyond the corresponding mounting pads to define a mounting contact stub, a majority of each mounting contact stub being removed such that the mounting contacts have different lengths.

14. The assembly of claim 9, wherein the electrical conductor defines a mounting pad embedded within the circuit board, the mounting contacts being directly connected to the mounting pad.

15. The assembly of claim 9, wherein the signal terminals are arranged in pairs carrying differential pair signals, the signal terminals of each pair extending to the same depth in the respective vias of the circuit board.

16. An electrical connector for mounting on a circuit board having vias with electrical conductors within the vias, the electrical connector comprising:
a housing having a mounting face configured to be mounted along the circuit board; and
a plurality of variable depth signal terminals held by the housing, the signal terminals being configured to extend different depths into respective vias of the circuit board, the signal terminals being arranged in pairs carrying differential pair signals, the signal terminals of each pair extending to the same depth in the respective vias of the circuit board, the signal terminals comprising mounting contacts extending outward from the mounting face of the housing, each mounting contact having a mounting end being at substantially the same depth within the via as the electrical conductor.

17. The connector of claim 16, wherein the mounting ends are elevated above a lower surface of the circuit board.

18. The connector of claim 16, wherein a segment of the mounting contact is removed during a counterboring process.

19. The connector of claim 16, wherein the mounting contact is C-shaped having a hollow interior, the mounting contact being configured to be counterbored such that a bottom portion of the mounting contact is removed to the desired depth within the via.

20. The connector of claim 16, wherein the circuit board includes a plurality of mounting pads at various depths within the circuit board, each via extending through a corresponding mounting pad, and wherein each mounting contact extends from the mounting face for approximately the same length when the housing is mounted to the circuit board, the mounting contacts extending beyond the corresponding mounting pads to define a mounting contact stub, a majority of each mounting contact stub being removed such that the mounting contacts have different lengths.

* * * * *